United States Patent [19]

Yifrach et al.

[11] Patent Number: 5,463,599
[45] Date of Patent: Oct. 31, 1995

[54] RADIO RECEIVER AND BUFFER SYSTEM THEREFOR

[76] Inventors: Aharon Yifrach, 19 Ayalon Street, Ashkelon, Israel; David S. Newman, 16,500 N. Park Dr., Apt. 1917, Southfield, Mich. 48075

[21] Appl. No.: 294,743

[22] Filed: Aug. 23, 1994

[51] Int. Cl.[6] .................................................. H04H 9/00
[52] U.S. Cl. ........................................... 369/7; 360/7
[58] Field of Search .............................. 369/7, 6; 360/7, 360/5; 455/345, 89, 186.1, 186.2; 381/34, 35, 36, 31; 379/88

[56] References Cited

U.S. PATENT DOCUMENTS

| | | | |
|---|---|---|---|
| 4,197,497 | 4/1980 | Phelps | 369/6 |
| 4,268,724 | 5/1981 | Hubbard | 369/7 |
| 4,305,101 | 12/1981 | Yarbrough et al. | 369/7 |
| 4,408,309 | 10/1983 | Kiesling et al. | 369/7 |
| 4,499,567 | 2/1985 | Armstrong | 369/7 |
| 4,596,041 | 6/1986 | Mack | 369/7 |
| 4,633,331 | 12/1986 | McGrady et al. | 360/7 |
| 4,805,217 | 2/1989 | Morihiro et al. | 369/7 |
| 4,841,574 | 6/1989 | Pham et al. | 381/31 |
| 4,965,569 | 10/1990 | Bennett et al. | 379/88 |
| 5,126,982 | 6/1992 | Yifrach | 369/7 |

FOREIGN PATENT DOCUMENTS

| | | | |
|---|---|---|---|
| 4108714 | 9/1991 | Germany | 369/7 |

*Primary Examiner*—Frank Gonzalez
*Assistant Examiner*—Tan Dinh
*Attorney, Agent, or Firm*—Ladas & Parry

[57] ABSTRACT

A buffer system for radio receivers includes an analog-to-digital converter, a digital cyclic storage device for continuously storing in digital form the audio signals last outputted thereby over a predetermined time interval, and a control circuit including a mode selector switch to select a Skip Mode, in which the receiver audio circuit receives the signals from the cyclic storage device with a slowly increasing delay from real-time, and another switch to connect the audio circuit to receive the audio signals real-time, and thus to skip a part of the broadcasted information. The mode selector may also select a Standby Mode for storing information broadcasted before the receiver has been turned on, and/or a Forward Mode for storing information broadcasted after the receiver has been turned off.

20 Claims, 2 Drawing Sheets

RADIO RECEIVER AND BUFFER SYSTEM THEREFOR

FIELD AND BACKGROUND OF THE INVENTION

The present invention relates to radio receivers, and particularly to a buffer system for radio receivers. The invention is especially useful with respect to the radio receiver and buffer system described in U.S. Pat. No. 5,126,982, and is therefore described below with respect to this application.

U.S. Pat. No. 5,126,982 describes a buffer system for a radio receiver which controls the radio receiver to permit the listener to play back information which had been previously broadcasted but possibly not completely registered by the listener. For this purpose, the buffer system comprises an analog-to-digital converter for converting to digital form the analog signals outputted by the processing (e.g., demodulater) circuit, a digital cyclic storage device connected to the processing circuit for continuously storing in digital form the audio signals last outputted thereby over a predetermined time interval, and a control circuit including a mode selector effective to select either (a) a Normal-Listening Mode, wherein the audio circuit is connected to receive the audio signals from the processing circuit in a real-time manner while the cyclic storage device continuously stores the audio signals last outputted by the processing circuit over a predetermined time interval, or (b) at least one other mode wherein the audio circuit is connected to receive the signals previously stored in the cyclic storage device.

In one described embodiment, the at least one other mode is a Delayed-Listening Mode, wherein the audio circuit is connected to receive the audio signals in a delayed-time manner from the processing circuit via the cyclic storage device.

In a second described embodiment, the buffer system includes a further storage device capable of storing all the information stored in the cyclic storage device during the predetermined time interval; also, the mentioned at least one other mode includes: (a) a Freeze Mode, wherein the cyclic storage device is connected to the further storage device to transfer its contents at that instant to a further storage device while the cyclic storage device continues to store the audio signals; or (b) a Playback Mode, wherein the audio circuit is connected to the further storage device to be fed the contents of the further storage device.

Such a buffer assembly thus permits the listener normally to hear the radio broadcast in a continuous manner, but whenever it is desired to rehear information which was previously broadcasted, this may be done by reading-out the contents of the cyclic storage device stored during the time interval corresponding to that in which the missed information was broadcasted.

OBJECTS AND BRIEF SUMMARY OF THE INVENTION

An object of the present invention is to provide a buffer system for radio receivers which enables the radio receiver to perform other functions in addition to or in lieu of the foregoing functions.

According to one aspect of the present invention, there is provided a buffer system for radio receivers having a processing circuit outputting audio signals to an audio analog circuit for reproduction as sounds, the buffer system comprising an analog-to-digital converter for converting to digital form the analog signals outputted by the processing circuit; and a digital cyclic storage device connected to the processing circuit for continuously storing in digital form the audio signals last outputted thereby over a predetermined time interval. The buffer system further includes a control circuit having a mode selector comprising a Skip-Mode manual switch actuatable to select a Skip Mode, in which the audio circuit is connected to receive the signals from the cyclic storage device at first with a slowly increasing delay from real-time such as not to unduly distort the audio signals until the delay reaches the predetermined time interval of the cyclic storage device, and thereafter with a delay from real-time equal to that of the predetermined time interval of the cyclic storage device; and a Skip-Mode manual switch actuatable to connect the audio circuit to receive the audio signals from the processing circuit in real-time, and thus to skip the portion of the audio signals from the processing circuit equal to that of the predetermined time interval of the cyclic storage device.

Such a system thus enables the user to "skip" commercials or other broadcasted information that the user is not particularly interested in hearing.

According to another aspect of the present invention, the mode selector further includes a Standby-Mode manual switch actuatable to select a Standby Mode, in which the cyclic storage device is connected to the processing circuit to store the audio signals therein even when the radio receiver is otherwise turned off. This feature enables the user to hear information that had been broadcasted before the user had turned on the radio.

According to a still further aspect of the present invention, the mode selector may further include a Forward-Mode manual switch actuatable to select a Forward Mode, in which the cyclic storage device is connected to the processing circuit to store the signals therein for a predetermined time interval immediately after the radio receiver has been turned off. This feature allows the user to record, for later playback, information which had been broadcasted after the user turned off the radio, e.g., when leaving an automotive vehicle containing such a radio.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
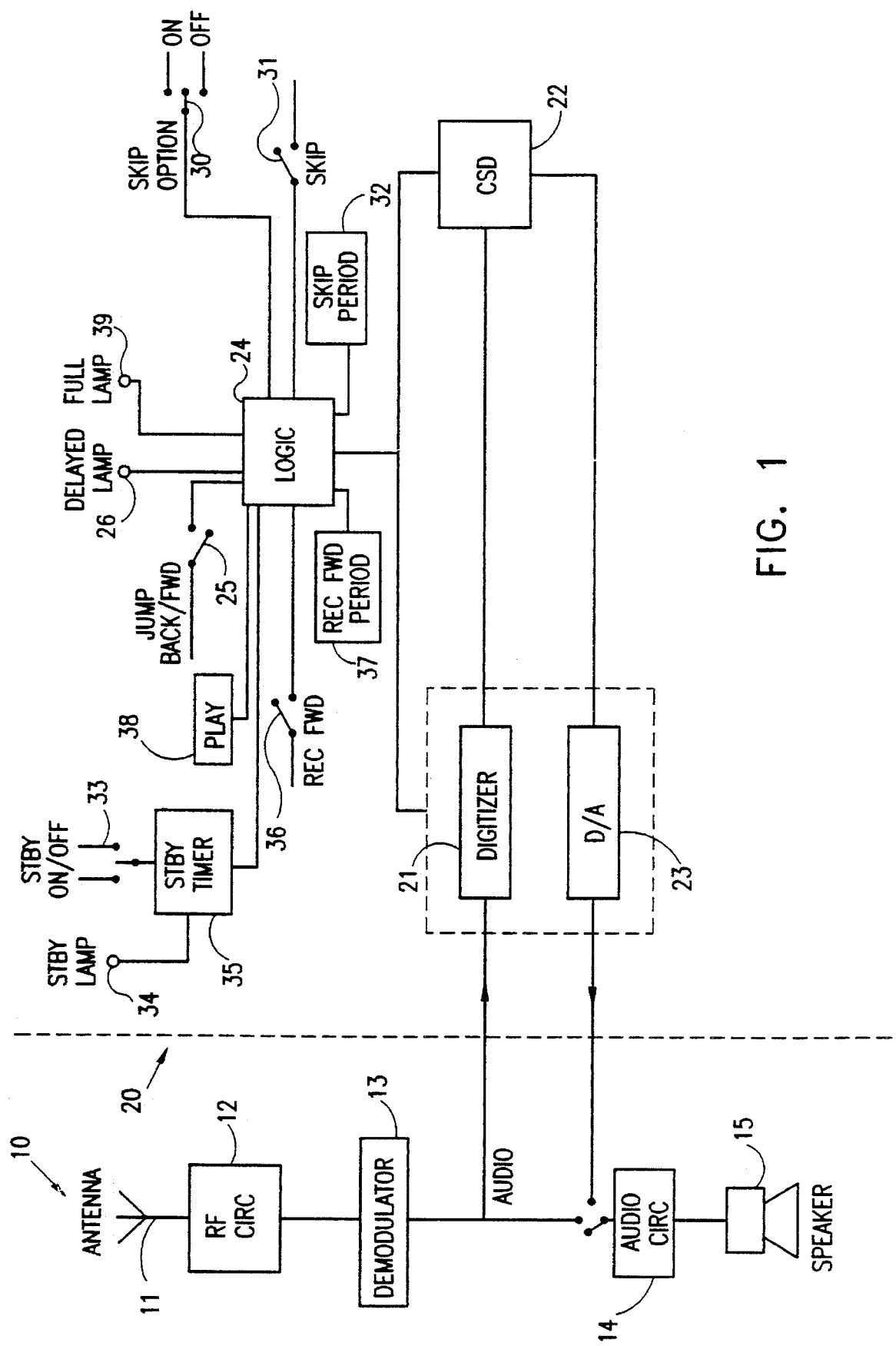
FIG. 1 is a block diagram illustrating a buffer system corresponding to that in FIG. 1 of U.S. Pat. No. 5,126,982, but modified to include the features of the present invention.

The Embodiment of FIG. 1

The buffer system illustrated in FIG. 1 is similar to that illustrated in FIG. 1 of U.S. Pat. No. 5,126,982. It is adapted to be included in a conventional radio receiver, generally designated 10, for equipping the receiver with the capability of playing back previously broadcasted information. The radio receiver 10, which may be of any conventional construction, includes an antenna 11 for receiving the RF signals, an RF amplifier circuit 12, a demodulator circuit 13 for extracting the audio signals from the carrier, and an audio circuit 14 for amplifying and further processing the audio signals before they are reproduced as sounds in the speaker 15.

According to the present invention, the radio receiver 10 illustrated in FIG. 1 is equipped with a buffer system, generally designated 20, inserted between the demodulator circuit 13 and the audio circuit 14.

The buffer system 20 illustrated in FIG. 1 comprises: a digitizer 21, namely an analog-to-digital converter, for converting the audio analog signals from the demodulator 13 to digital form; a cyclic storage device 22 for continuously storing the audio signals last outputted from demodulator 13 via digitizer 21; and a digital-to-analog converter 23 for reconverting to analog form the output from the cyclic storage device 22 before such output is fed to the audio circuit 14 of the receiver.

The cyclic storage device 22 is a digital storage device, such as a RAM (random access memory) having a storage capacity for continuously storing the audio signals last outputted by the demodulator 13 over a predetermined time interval. This time interval may be preselected for each particular application and would usually be within the range of 10–300 seconds, a preferred time interval being about 60 seconds.

The buffer system 20 illustrated in FIG. 1 further includes a control system comprising a logic circuit 24 and a Mode-Selector manual switch 25 in the form of a JB/F (Jump Back/Forward) button conected to the logic circuit 24 which selects either of the following two modes of operation of the buffer system:

(a) When the JB/F button is not depressed, logic circuit 24 selects a Normal-Listening Mode, wherein the audio circuit 14 is connected to receive the audio signals from the demodulator circuit 13 in a real-time manner, while the cyclic storage device 22 continuously stores the audio signals last outputted by the demodulator circuit over a predetermined time interval.

(b) When the JB/F button is depressed, it selects a Delayed-Listening Mode, wherein the logic circuit 24 connects the audio circuit 14 to receive the audio signals in a delayed-time manner from the demodulator circuit 13 via the cyclic storage device 22.

(c) When the JB/F button is next depressed, logic circuit 24 returns the system to the Normal-Listening Mode.

Buffer system 20 further includes a light indicator 26 controlled by the logic circuit 24 such that the light indicator is not energized in the Normal-Listening Mode, but is energized in the Delayed-Listening Mode.

Insofar as described, the system illustrated in FIG. 1 operates as follows:

Normally, the JB/F button 25 is not depressed, in which case the system operates according to the Normal-Listening Mode. In this mode, the audio circuit 14 is connected to receive the audio signals from the demodulator circuit 13 in a real-time manner, so that the listener hears the radio broadcasts in real-time. At the same time, the cyclic storage device continuously stores the audio signals last outputted by the demodulator circuit 13 over a predetermined time interval, e.g., the last 60 seconds. During this Normal-Listening mode of operation, indicator lamp 26 is not energized.

Should the listener wish to rehear information which had just been broadcasted, the listener depresses the JB/F button 25. This causes the logic circuit 24 to switch the system from the Normal-Listening Mode to the Delayed-Listenings Mode. In this mode, the audio circuit 14 is connected to receive the audio signals in a delayed-time manner from the demodulator circuit 13 via the cyclic storage device, so that the listener hears the broadcast not in real-time, but rather in a 60-second delayed time. Thus, the listener will rehear the information previously broadcast within the past 60 seconds, and from then on in a 60-second delayed time.

At any time thereafter, the listener may depress the JB/F button again, whereupon the logic circuit 24 reswitches the system back to the Normal-Listening Mode. The audio circuit 14 is then reconnected to receive the audio signals from the demodulator circuit 13 in a real-time manner. The cyclic storage device 22, however, continuously stores the audio signals last outputted by the demodulator circuit over the 60-second time interval, so that this information is again available to the listener whenever desired by again depressing the JB/F button.

When indicator lamp 26 is not energized, this indicates to the listener that the system is in the Normal-Listening Mode and the broadcasts are being heard in a real-time manner; whereas when the indicator lamp 26 is energized, this indicates that the system is in the Delayed-Listening Mode wherein the broadcasts are being heard in a delayed-time manner.

The system so far described FIG. 1 is substantially the same as that described with reference to FIG. 1 in U.S. Pat. No. 5,126,982. FIG. 1 of the present application, however, includes additional features to enable the user to select additional modes of operation.

One additional mode of operation is the Skip Mode, which allows the user to skip undesired information, such as commercials. The Skip Mode is selected by a Skip-Mode manual switch 30, e.g., a depressible switch, which is normally Off, but which when depressed to the On position selects the Skip Mode. When this mode is selected, the logic circuit 24 connects the audio circuit 14 to receive the audio signals from the cyclic storage device 22 at first with a slowly increasing delay from real-time, such as not to unduly distort the audio signals, until the delay reaches the predetermined time interval of the cyclic storage device (e.g., one minute); thereafter, the logic circuit 24 connects the audio circuit 14 to receive the audio signals stored in the cyclic storage device 22 with a delay from real-time equal to that of the predetermined time interval of the cyclic storage device, e.g., one minute.

Accordingly, when the Skip Mode is selected by Skip-Mode manual switch 30, the system will drift very slowly (without noticeable distortion) to the preselected delay of the cyclic storage device 22, and thereafter the user will hear the broadcasted information via the audio circuit in a delayed-time manner.

The receiver will stay in this delay from real-time until the user decides to skip information then being broadcasted, such as a commercial. When the user decides to skip e.g., a commercial, the user will depress Skip manual switch 31. This controls the logic circuit 24 to connect the audio circuit 14 to receive the audio signals from the demodulator circuit 13 in a real-time manner, and thus to "skip" the portion of the audio signals from the demodulator equal to that of the predetermined time interval of the cyclic storage device 22.

The information thus "skipped" would be that recorded in the cyclic storage device 22 during the predetermined time interval of that storage device, e.g., one minute. The system illustrated in FIG. 1 further includes a "skip period" circuit 32 which may be presettable by the user to preset any desired "skip period" less than that of the cyclic storage device 22.

The system illustrated in FIG. 1 further includes the option to select a Standby Mode, which allows the user to hear information that was broadcasted before the radio receiver was turned on. The system thus includes a Standby manual switch 33 which, when operated to its On position, selects the Standby Mode. This controls the logic circuit 24 to connect the cyclic storage device 22 to the demodulator circuit 13 to store the audio signals therein even when the radio receiver is otherwise turned off. Thus, when the Standby Mode is selected, the broadcasted information is continuously received and recorded in the cyclic storage device 22 even when the receiver is otherwise turned off, so that the information so recorded in the cyclic storage device 22 may be fed to the audio circuit 14 for reproduction to the listener when the user actuates the Jump Back switch 25. A Standby lamp 34 is energized when the system is in the Standby Mode.

In those cases where the radio receiver is battery operated, the continuous operation in the Standby Mode may completely drain the battery. To avoid this, the illustrated system includes a Standby timer 35 which will automatically turn-off the complete radio receiver after a preselected long time interval, preferably at least ten hours (e.g., after three days) to prevent battery drain; also, the audio circuit may be automatically turned-off in the Standby Mode.

A further mode of operation provided by the receiver illustrated in FIG. 1 is a Record Forward Mode. This allows the user to record in the cyclic storage device 22 information which is broadcasted for a short interval after the radio receiver is turned off. For example, the driver of a motor vehicle including the radio receiver may have to leave the car when arriving at the driver's destination but the program the driver was listening to is not completed, and the driver wishes to be able to hear the information broadcasted after the driver leaves the vehicle. This Record Forward option may be manually selected by Forward-Mode manual switch 36. This controls the logic circuit 24 to connect the cyclic storage device 22 to the demodulator circuit 13 to store the audio signals therefrom for a predetermined time interval immediately after the radio receiver has been turned off. The predetermined time interval may be selected by a Record Forward period selector 37. The buffer system will then record the information until the cyclic storage device 22 is full. When the driver returns to the vehicle, the driver may then depress the Play switch 38, whereupon the information stored in the cyclic storage device 22 will be played back via the audio circuit. Indicator lamp 39 is energized to indicate that the cyclic storage device is full.

Figure 2:
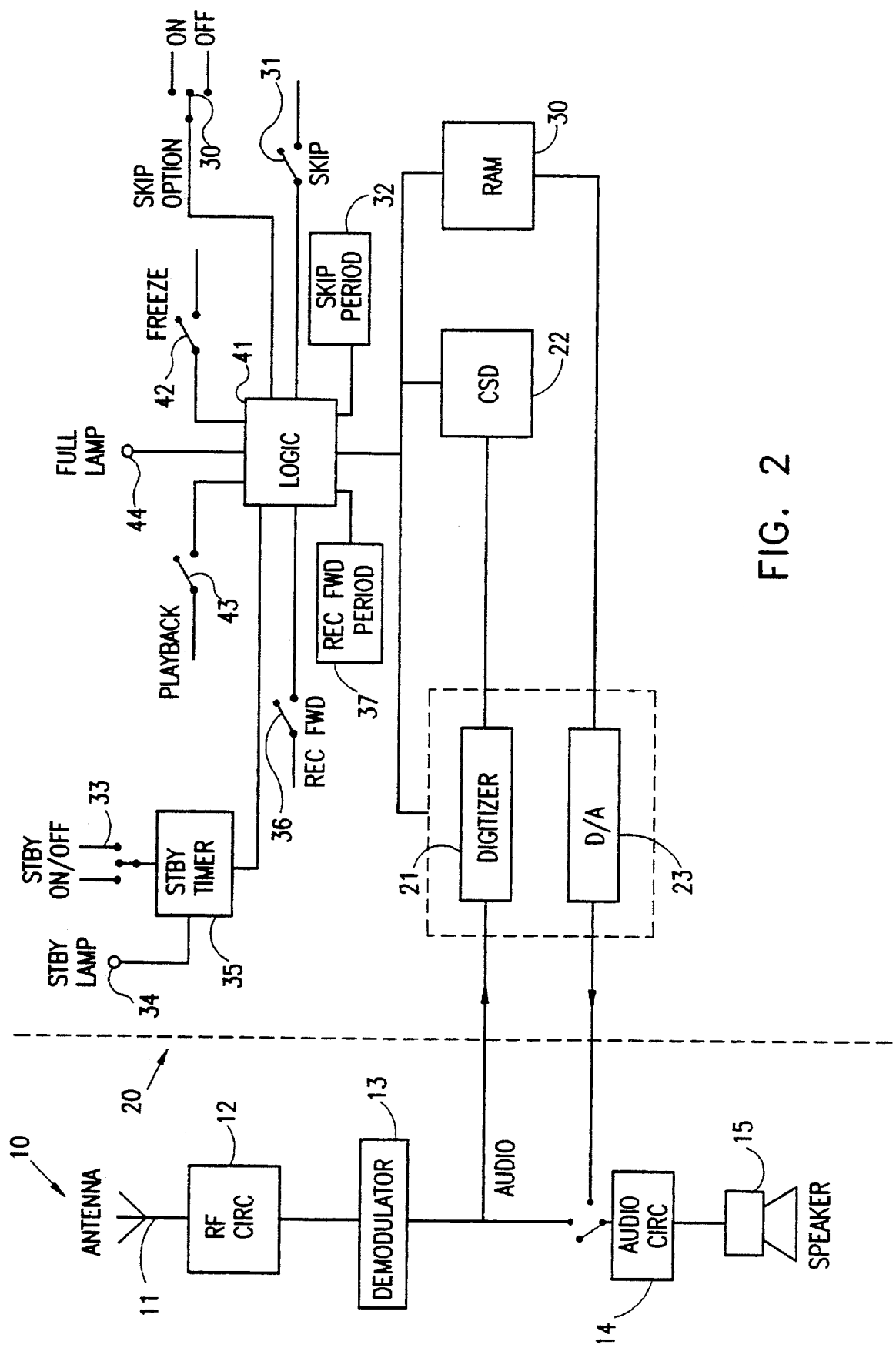
FIG. 2 is a block diagram illustrating a buffer system corresponding to that in FIG. 2 of U.S. Pat. No. 5,126,982, but modified to include the features of the present invention.

The Embodiment of FIG. 2

The buffer system illustrated in FIG. 2 is very similar to that of FIG. 1, except that it enables the listener not only to hear the radio broadcasts in a real-time manner, but also to freeze a portion of the broadcast for later playback whenever desired.

Thus, the buffer system illustrated in FIG. 2 includes all the elements of the conventional radio receiver 10, which elements have been correspondingly numbered. It also includes the digitizer 21, cyclic storage device 22, and digital-to-analog converter 23 of the buffer system 20, which elements have also been correspondingly numbered. However, the system of FIG. 2 includes, in addition, a further storage device 30, and another logic circuit 41 controlled by two depressible buttons, namely a Freeze button 42, and a Playback button 43. The further storage device 30, in the form of another RAM, is capable of storing all the information stored in the cyclic storage device 22. A light indicator 44 is controlled by the logic circuit 41. Logic circuit 41 is in turn controlled by the two buttons 42 and 43, in the following manner:

(a) When neither Freeze button 42 nor Playback button 43 is depressed, the logic circuit 41 operates the system according to the Normal-Listening Mode wherein, as described above with respect to the FIG. 1 embodiment, the audio circuit 14 is connected to receive the audio signals from the demodulator circuit 13 in a real-time manner, while the cyclic storage device 22 continuously stores the audio signals last outputted by the demodulator circuit 13 over a predetermined time interval, e.g., 60 seconds.

(b) When the Freeze button 42 is depressed, it controls the logic circuit 41 to select a Freeze Mode. In this mode, the cyclic storage device 22 is connected to the further storage device 30 to transfer its contents at that instant to the further storage device. That is, the last 60-seconds of the broadcast are thus "frozen" in the further storage device 30, while the cyclic storage device 22 continues to store the audio signals last outputted by the demodulator circuit 13 over the predetermined 60-second time interval. If the Freeze button 42 should be again depressed, the logic circuit 41 causes the previous contents of the further storage device 30 to be replaced by the contents of the cyclic storage device 22, i.e., the last 60-seconds of the broadcast. The listener, however, continues to hear the broadcasts in a real-time manner.

(c) Now whenever the listener wishes to play back the 60-seconds of broadcast "frozen" by depressing the Freeze button 42, this is effected by depressing the Playback button 43, which controls the logic circuit 41 to select the Playback Mode. In this mode, the audio circuit 14 is connected to the further storage device 30 to receive its contents, thereby playing back to the listener the 60-seconds of broadcast frozen in that device. After the contents of the further storage device 30 have been fed to the audio circuit 14, the system automatically returns to the Normal-Listening Mode.

Indicator lamp 44 is controlled by the logic circuit 41 such that: (a) it is not energized in the Normal-Listening Mode; (b) it is energized when data is frozen in storage device 30; and (c) is caused to "blink" in the Playback Mode.

The various modes of operation optionally provided by elements 30–39 in the circuit of FIG. 1 are also provided by the correspondingly-numbered elements in FIG. 2 in the same manner as described above with respect to FIG. 1, except that in the Standby Mode of operation, the information broadcasted before the receiver is turned on is recorded in the cyclic storage device 22 and is played back by depressing the Playback key 43.

While the invention has been described with respect to two preferred embodiments, it will be appreciated that these are set forth merely for purposes of example, and that many other variations, modifications and applications of the invention may be made.

We claim:

1. A buffer system for radio receivers having a processing circuit outputting audio signals to an audio analog circuit for reproduction as sounds, said buffer system comprising:

an analog-to-digital converter for converting to digital form the analog signals outputted by the processing circuit;

a digital cyclic storage device connected to the processing circuit for continuously storing in digital form the audio signals last outputted thereby over a predetermined time interval;

and a control circuit including a mode selector comprising:

a Skip-Mode manual switch actuatable to select a Skip Mode, in which the audio circuit is connected to receive the signals from the cyclic storage device at first with a slowly increasing delay from real-time such as not to unduly distort the audio signals until the delay reaches the predetermined time interval of the cyclic storage device, and thereafter with a delay from real-time equal to that of the predetermined time interval of the cyclic storage device;

and a Skip manual switch actuatable to connect the audio circuit to receive the audio signals from the processing circuit in real-time, and thus to skip the portion of the audio signals from the processing circuit equal to that of said predetermined time interval of the cyclic storage device.

2. The buffer system according to claim 1, wherein said predetermined time delay is about one minute.

3. The buffer system according to claim 1, wherein said mode selector further includes:

a Standby manual switch actuatable to select a Standby Mode, in which the cyclic storage device is connected to said processing circuit to store the audio signals therein even when the radio receiver is otherwise turned off.

4. The buffer system according to claim 3, wherein said control circuit further includes a visual indicator which is energized when said Standby Mode is selected.

5. The buffer system according to claim 3, wherein the radio receiver is battery operated, and said control circuit further includes a Standby timer effective to turn-off the complete radio receiver after a long predetermined time interval of operation under said Standby Mode.

6. The buffer system according to claim 5, wherein said long predetermined time interval is at least ten hours.

7. The buffer system according to claim 1, wherein said mode selector further includes:

a Forward-Mode manual switch actuatable to select a Forward Mode, in which the cyclic storage device is connected to said processing circuit to store the signals therein for a predetermined time interval immediately after the radio receiver has been turned off.

8. The buffer system according to claim 7, wherein said control circuit further includes a visual indicator which is energized when said Forward Mode is selected.

9. The buffer system according to claim 1, wherein said mode selector further includes a Mode-Selector manual switch to select either:

(a) a Normal Listening Mode, wherein the audio circuit is connected to receive the audio signals from the processing circuit in a real-time manner, while the cyclic storage device continuously stores the audio signals last outputted by the processing circuit over said predetermined time interval; or (b) at least one other mode wherein the audio circuit is connected to receive the signals previously stored in the cyclic storage device.

10. The buffer system according to claim 9, wherein said at least one other mode is a Delayed-Listening Mode, wherein the audio circuit is connected to receive the audio signals in a delayed-time manner from the processing circuit via the cyclic storage device.

11. The buffer system according to claim 9, wherein the buffer system also includes a further storage device capable of storing all the information stored in the cyclic storage device during said predetermined time interval; and wherein said at least one other mode includes:

(i) a Freeze Mode, wherein the cyclic storage device is connected to the further storage device to transfer its contents to the further storage device while the cyclic storage device continues to store the audio signals last outputted by the processing circuit over said predetermined time interval; and (ii) a Playback Mode, wherein the audio circuit is connected to the further storage device to be fed the contents of the further storage device.

12. A buffer system for radio receivers having a processing circuit outputting audio signals to an audio analog circuit for reproduction as sounds, said buffer system comprising:

an analog-to-digital converter for converting to digital form the analog signals outputted by the processing circuit;

a digital cyclic storage device connected to the processing circuit for continuously storing in digital form the audio signals last outputted thereby over a predetermined time interval;

and a control circuit including a mode selector comprising:

a Mode-Selector manual switch actuatable to select either (i) a Normal-Listening Mode, wherein the audio circuit is connected to receive the audio signals from the processing circuit in a real-time manner, while the cyclic storage device continuously stores the audio signals last outputted by the demodulator circuit over a predetermined time interval; or (ii) at least one other mode wherein the audio circuit is connected to receive the signals previously stored in the cyclic storage device;

and a Standby manual switch actuatable to select a Standby Mode to connect the cyclic storage device to said processing circuit to store the audio signals therein even when the radio receiver is otherwise turned off.

13. The buffer system according to claim 12, wherein said mode selector further includes:

a Skip-Mode manual switch actuatable to select a Skip Mode, in which the audio circuit is connected to receive the signals from the cyclic storage device at first with a slowly increasing delay from real-time such as not to unduly distort the audio signals until the delay reaches the predetermined time interval of the cyclic storage device, and thereafter with a delay from real-time equal to that of the predetermined time interval of the cyclic storage device;

and a Skip manual switch actuatable to connect the audio circuit to receive the audio signals from the processing circuit in real-time, and thus to skip the portion of the audio signals from the processing circuit equal to that of said predetermined time interval of the cyclic storage device.

14. The buffer system according to claim 12, wherein said at least one other mode is a Delayed-Listening Mode, wherein the audio circuit is connected to receive the audio signals in a delayed-time manner from the processing circuit via the cyclic storage device.

15. The buffer system according to claim 12, wherein the buffer system also includes a further storage device capable of storing all the information stored in the cyclic storage device during said predetermined time interval; and wherein said at least one other mode includes:

(i) a Freeze Mode, wherein the cyclic storage device is connected to the further storage device to transfer its contents to the further storage device while the cyclic storage device continues to store the audio signals last outputted by the processing circuit over said predetermined time interval; and (ii) a Playback Mode, wherein the audio circuit is connected to the further storage device to be fed the contents of the further storage device.

16. A buffer system for radio receivers having a processing circuit outputting audio signals to an audio analog circuit for reproduction as sounds, said buffer system comprising:

an analog-to-digital converter for converting to digital form the analog signals outputted by the processing circuit;

a digital cyclic storage device connected to the processing circuit for continuously storing in digital form the audio signals last outputted thereby over a predetermined time interval;

and a control circuit including a mode selector comprising:

a Mode-Selector manual switch actuatable to select either (i) a Normal-Listening Mode, wherein the audio circuit is connected to receive the audio signals from the processing circuit in a real-time manner, while the cyclic storage device continuously stores the audio signals last outputted by the demodulator circuit over a predetermined time interval; or (ii) at least one other mode wherein the audio circuit is connected to receive the signals previously stored in the cyclic storage device;

and a Forward-Mode manual switch actuatable to select a Forward Mode, in which the cyclic storage device is connected to said processing circuit to store the signals therein for a predetermined time interval immediately after the radio receiver has been turned off.

17. The buffer system according to claim 16, wherein said mode selector further includes:

a Skip-Mode manual switch actuatable to select a Skip Mode, in which the audio circuit is connected to receive the signals from the cyclic storage device at first with a slowly increasing delay from real-time such as not to unduly distort the audio signals until the delay reaches the predetermined time interval of the cyclic storage device, and thereafter with a delay from real-time equal to that of the predetermined time interval of the cyclic storage device;

and a Skip manual switch actuatable to connect the audio circuit to receive the audio signals from the processing circuit in real-time, and thus to skip the portion of the audio signals from the processing circuit equal to that of said predetermined time interval of the cyclic storage device.

18. The buffer system according to claim 16, wherein said at least one other mode is a Delayed-Listening Mode, wherein the audio circuit is connected to receive the audio signals in a delayed-time manner from the processing circuit via the cyclic storage device.

19. The buffer system according to claim 16, wherein the buffer system also includes a further storage device capable of storing all the information stored in the cyclic storage device during said predetermined time interval; and wherein said at least one other mode includes:

(i) a Freeze Mode, wherein the cyclic storage device is connected to the further storage device to transfer its contents to the further storage device while the cyclic storage device continues to store the audio signals last outputted by the processing circuit over said predetermined time interval; or (ii) a Playback Mode, wherein the audio circuit is connected to the further storage device to be fed the contents of the further storage device.

20. A radio receiver comprising:

a processing circuit outputting audio signals;

an audio circuit for reproducing the audio signals in the form of sounds;

and a buffer system according to claim 1 for controlling the audio circuit.

* * * * *